(12) United States Patent
Katou et al.

(10) Patent No.: US 11,239,231 B2
(45) Date of Patent: Feb. 1, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Hiroaki Katou, Nonoichi Ishikawa (JP); Tatsuya Nishiwaki, Komatsu Ishikawa (JP); Kenya Kobayashi, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/012,144

(22) Filed: Sep. 4, 2020

(65) Prior Publication Data
US 2021/0225837 A1 Jul. 22, 2021

(30) Foreign Application Priority Data
Jan. 22, 2020 (JP) .............................. JP2020-008267

(51) Int. Cl.
*H01L 27/06* (2006.01)
*H01L 49/02* (2006.01)
(Continued)

(52) U.S. Cl.
CPC .......... *H01L 27/0629* (2013.01); *H01L 28/20* (2013.01); *H01L 29/407* (2013.01); *H01L 29/7813* (2013.01); *H01L 29/861* (2013.01)

(58) Field of Classification Search
CPC . H01L 27/0629; H01L 28/20; H01L 29/7813; H01L 29/861; H01L 29/407
(Continued)

(56) References Cited

U.S. PATENT DOCUMENTS

| 9,923,066 | B2 | 3/2018 | Kueck et al. |
| 2013/0082768 | A1* | 4/2013 | Hirler .................... H01L 29/40 327/580 |

(Continued)

FOREIGN PATENT DOCUMENTS

| JP | 2012-244071 A | 12/2012 |
| JP | 2017-98385 A | 6/2017 |

(Continued)

OTHER PUBLICATIONS

Hirler, et al., "Trench Superjunction Process Window extended", ISPSD 2009, Infineon YFET.
(Continued)

*Primary Examiner* — Igwe U Anya
(74) *Attorney, Agent, or Firm* — Allen & Overy LLP

(57) ABSTRACT

A semiconductor device includes a semiconductor part; first and second electrodes respectively on back and front surfaces of the semiconductor part; a control electrode provided inside a trench of the semiconductor part; a third electrode provided inside the trench; a diode element provided at the front surface of the semiconductor part; a resistance element provided on the front surface of the semiconductor part via an insulating film, the diode element being electrically connected to the second electrode; a first interconnect electrically connecting the diode element and the resistance element, the first interconnect being electrically connected to the third electrode; and a second interconnect electrically connecting the resistance element and the semiconductor part. The resistance element is connected in series to the diode element. The diode element is provided to have a rectifying property reverse to a current direction flowing from the resistance element to the second electrode.

15 Claims, 11 Drawing Sheets

(51) Int. Cl.
*H01L 29/78* (2006.01)
*H01L 29/40* (2006.01)
*H01L 29/861* (2006.01)

(58) Field of Classification Search
USPC .......................................................... 257/334
See application file for complete search history.

(56) References Cited

U.S. PATENT DOCUMENTS

| | | | |
|---|---|---|---|
| 2013/0146971 A1* | 6/2013 | Hirler | H01L 29/7813 257/334 |
| 2014/0098585 A1* | 4/2014 | Ikeda | H02M 7/04 363/126 |
| 2017/0062410 A1* | 3/2017 | Loechelt | H03K 17/08142 |
| 2019/0288102 A1 | 9/2019 | Kobayashi | |

FOREIGN PATENT DOCUMENTS

| | | |
|---|---|---|
| JP | 6449821 B2 | 1/2019 |
| JP | 2019-165060 A | 9/2019 |

OTHER PUBLICATIONS

Peake, S., et al., "A Novel High Side FET with Reduced Switching Losses", ISPSD 2003, Philips Research Split-gate MOSFET.
Konagai Makoto, "Semiconductor Physics", Baifukan p. 184-186 [Machine Translation of excerpts].
Sasaki, Akio, "Analog C/DMOS Device Process Technology", Fuji Electric Journal, vol. 73, No. 8, 2000, p. 456-458 [Machine Translation of excerpts].

* cited by examiner

SEMICONDUCTOR DEVICE

CROSS-REFERENCE TO RELATED APPLICATIONS

This application is based upon and claims the benefit of priority from Japanese Patent Application No. 2020-008267, filed on Jan. 22, 2020; the entire contents of which are incorporated herein by reference.

FIELD

Embodiments relate to a semiconductor device.

BACKGROUND

It is desirable for a semiconductor device used in power control to have a small ON-resistance and a high breakdown voltage in the OFF-state. For example, a low ON-resistance and a high breakdown voltage are achieved in a MOS transistor having a trench gate structure in which a gate electrode and a field plate electrode are provided inside a gate trench. For example, the field plate electrode is provided between the gate electrode and the drain electrode. Therefore, it is desirable for the field plate insulating film that insulates the field plate electrode from the semiconductor layer to be highly insulative. However, when the field plate insulating film is made thicker to obtain the high breakdown voltage, the current path between the gate trenches may become narrow and inhibit the reduction of the ON-resistance.

DETAILED DESCRIPTION

Figure 1:
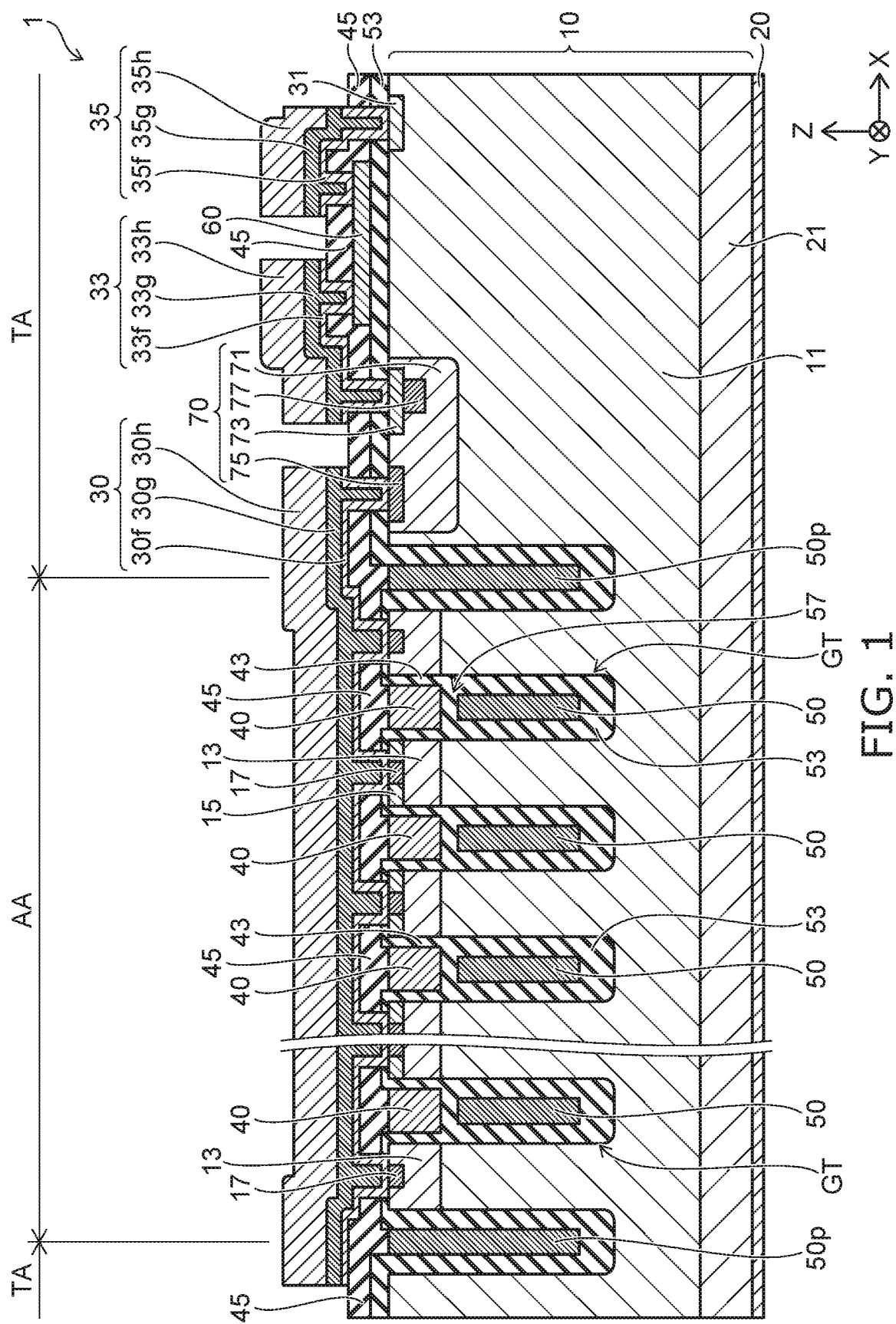
FIG. 1 is a schematic cross-sectional view showing a semiconductor device according to an embodiment.

According to one embodiment, a semiconductor device includes a semiconductor part; a first electrode provided on a back surface of the semiconductor part; a second electrode provided on a front surface of the semiconductor part; a control electrode provided between the second electrode and the semiconductor part inside a trench of the semiconductor part; a third electrode provided inside the trench, the third electrode being provided more proximate to the first electrode than a distance between the control electrode and the first electrode; a diode element provided at the front surface of the semiconductor part, the diode element is electrically connected to the second electrode; a resistance element provided on an insulating film covering the front surface of the semiconductor part; a first interconnect electrically connecting the diode element and the resistance element, the first interconnect being electrically connected to the third electrode; and a second interconnect electrically connecting the resistance element and the semiconductor part. The control electrode is electrically insulated from the semiconductor part by a first insulating portion inside the trench. The control electrode is electrically insulated from the second electrode by a second insulating portion between the control electrode and the second electrode. The third electrode is electrically insulated from the semiconductor part by a third insulating portion inside the trench. The third electrode is electrically insulated from the control electrode by a fourth insulating portion between the third electrode and the control electrode. The semiconductor part includes a first semiconductor layer of a first conductivity type, a second semiconductor layer of a second conductivity type, and a third semiconductor layer of the first conductivity type. The first semiconductor layer is provided between the first electrode and the second electrode, between the first electrode and the diode element, and between the first electrode and the resistance element. The first semiconductor layer is electrically connected to the resistance element via the second interconnect. The second semiconductor layer is provided between the first semiconductor layer and the second electrode, the second semiconductor layer facing the control electrode via the first insulating portion. The third semiconductor layer is selectively provided between the second semiconductor layer and the second electrode. The third semiconductor layer is provided at a position contacting the first insulating portion, and electrically connected to the second electrode. The resistance element is connected in series to the diode element. The diode element is provided to have a rectifying property reverse to a current direction flowing from the resistance element to the second electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 to FIG. 4 are schematic views showing a semiconductor device 1 according to an embodiment. The semiconductor device 1 is, for example, a MOS transistor used for power control. The semiconductor device 1 includes a resistance element and a diode element.

FIG. 1 is a schematic cross-sectional view showing the semiconductor device 1. The semiconductor device 1 includes a semiconductor part 10, a first electrode (hereinbelow, a drain electrode 20), and a second electrode (hereinbelow, a source electrode 30). The drain electrode 20 is provided at the back surface of the semiconductor part 10. The source electrode 30 is provided at the front surface of the semiconductor part 10.

The semiconductor part 10 is, for example, silicon. The drain electrode 20 is, for example, a metal layer including aluminum, titanium, etc. The source electrode 30 is, for example, a metal layer including aluminum, tungsten, etc.

For example, the semiconductor device 1 has a trench gate structure including a gate electrode 40 and a field plate electrode (hereinbelow, a FP electrode 50). The gate electrode 40 and the FP electrode 50 are, for example, conductive polysilicon.

The gate electrode 40 and the FP electrode 50 are provided between the semiconductor part 10 and the source electrode 30. The semiconductor part 10 has a gate trench at the front surface side. The gate electrode 40 and the FP electrode 50 are provided in the gate trench GT. For example, the gate electrode 40 is provided between the source electrode 30 and the FP electrode 50. The FP electrode 50 is positioned between the drain electrode 20 and the gate electrode 40.

For example, the gate electrode 40 is electrically insulated from the semiconductor part 10 by a first insulating portion (hereinbelow, an insulating film 43). Also, for example, the gate electrode 40 is electrically insulated from the source electrode 30 by a second insulating portion (hereinbelow, an inter-layer insulating film 45). The insulating film 43 and the inter-layer insulating film 45 are, for example, silicon oxide films.

The FP electrode 50 is electrically insulated from the semiconductor part 10 by a third insulating portion (hereinbelow, a portion of an insulating film 53). The insulating film 53 is provided inside the gate trench GT and includes a portion serves as the third insulating portion. A portion of the insulating film 53 is provided between the semiconductor part 10 and the FP electrode 50 inside the gate trench GT. The insulating film 53 is, for example, a silicon oxide film.

The FP electrode 50 is provided apart from the gate electrode 40 and is electrically insulated from the gate electrode 40 by a fourth insulating portion (hereinbelow, an insulating film 57). The insulating film 57 is provided between the gate electrode 40 and the FP electrode 50. The insulating film 57 is, for example, a silicon oxide film.

The semiconductor device 1 includes, for example, an active region AA and a terminal region TA in the X-Y plane. A trench gate that includes the gate electrode 40 and the FP electrode 50 is provided in the active region AA. The terminal region TA surrounds the active region AA. A gate trench GT provided at the boundary between the active region AA and the terminal region TA includes a FP electrode 50$p$, and does not include the gate electrode 40.

The semiconductor device 1 further includes a resistance element 60 and a diode element 70. The resistance element 60 and the diode element 70 are provided in the terminal region TA. The resistance element 60 and the diode element 70 are provided at the front surface of the semiconductor part 10.

For example, the resistance element 60 is provided on another portion of the insulating film 53 that covers the front surface of the semiconductor part 10 in the terminal region TA. The resistance element 60 is electrically connected to the drain electrode 20 via an interconnect 35 and n-type regions (e.g., an n-type contact layer 31, an n-type drift layer 11, and an n-type drain layer 21) of the semiconductor part 10. The resistance element 60 is, for example, a polysilicon layer having a prescribed resistivity.

For example, the diode element 70 is provided inside the semiconductor part 10. The diode element 70 is connected in series to the resistance element 60. The cathode of the diode element 70 is connected to the resistance element 60, for example, via an interconnect 33. The anode of the diode element 70 is electrically connected to the source electrode 30.

As shown in FIG. 1, the semiconductor part 10 includes, for example, a first semiconductor layer (hereinbelow, the n-type drift layer 11), a second semiconductor layer (hereinbelow, a p-type diffusion layer 13), a third semiconductor layer (hereinbelow, an n-type source layer 15), a p-type contact layer 17, and the n-type drain layer 21.

The n-type drift layer 11 extends in both the active region AA and the terminal region TA. The n-type drift layer 11 is provided between the drain electrode 20 and the source electrode 30, between the drain electrode 20 and the resistance element 60, and between the drain electrode 20 and the diode element 70.

The p-type diffusion layer 13 is provided between the n-type drift layer 11 and the source electrode 30. The p-type diffusion layer 13 is provided in the active region AA and faces the gate electrode 40 via the insulating film 43.

The n-type source layer 15 is selectively provided between the p-type diffusion layer 13 and the source electrode 30. The n-type source layer 15 contacts the insulating film 43. The n-type source layer 15 includes an n-type impurity with a higher concentration than the concentration of the n-type impurity in the n-type drift layer 11. The n-type source layer 15 is not provided between the gate trenches GT, one of which includes the FP electrode 50$p$ provided at the boundary between the active region AA and the terminal region TA and the other of which is most proximate thereto.

The p-type contact layer 17 is selectively provided between the p-type diffusion layer 13 and the source electrode 30. The p-type contact layer 17 includes a p-type impurity with a higher concentration than the concentration of the p-type impurity in the p-type diffusion layer 13.

For example, the n-type source layer 15 and the p-type contact layer 17 are arranged along the source electrode 30 between the p-type diffusion layer 13 and the source electrode 30. The source electrode 30 is electrically connected to the n-type source layer 15 and the p-type contact layer 17. The source electrode 30 is electrically connected to the p-type diffusion layer 13 via the p-type contact layer 17.

The n-type drain layer 21 is provided between the n-type drift layer 11 and the drain electrode 20. The n-type drain layer 21 includes an n-type impurity with a higher concentration than the concentration of the n-type impurity in the n-type drift layer 11. The drain electrode 20 is electrically connected to the n-type drain layer 21. The drain electrode 20 is electrically connected to the n-type drift layer 11 via the n-type drain layer 21.

The semiconductor part 10 further includes the n-type contact layer 31, a p-type well 71, an n-type cathode layer 73, a p-type anode layer 75, and a p-type intermediate layer 77. The n-type contact layer 31, the p-type well 71, the n-type cathode layer 73, the p-type anode layer 75, and the p-type intermediate layer 77 are provided in the terminal region TA.

The n-type contact layer 31 includes an n-type impurity with a higher concentration than the concentration of the n-type impurity in the n-type drift layer 11. For example, the n-type contact layer 31 is formed simultaneously with the n-type source layer 15 and includes an n-type impurity with the same concentration as the concentration of the n-type impurity in the n-type source layer 15. The resistance element 60 is electrically connected to the n-type contact layer 31 via the interconnect 35.

The diode element 70 is provided inside the p-type well 71. The diode element 70 includes the n-type cathode layer 73, the p-type anode layer 75, and the p-type intermediate layer 77. For example, the p-type well 71 includes a p-type impurity with substantially the same concentration as the concentration of the p-type impurity in the p-type diffusion layer 13. The p-type well 71 has a depth from the front surface of the semiconductor part 10 to the n-type drift layer 11. The depth of the p-type well 71 is deeper than a depth of the p-type diffusion layer 13 to the n-type drift layer 11 from the front surface of the semiconductor part 10. Also, the p-type well 71 may include a p-type impurity with a lower concentration than the concentration of the p-type impurity in the p-type diffusion layer 13.

The n-type cathode layer 73 and the p-type anode layer 75 are selectively provided at the front surface of the p-type well 71. The n-type cathode layer 73 is exposed at the front surface of the p-type well 71 and is electrically connected to the resistance element 60 via the interconnect 33. The p-type anode layer 75 is exposed at the front surface of the p-type well 71 and is electrically connected to the source electrode 30.

The p-type intermediate layer 77 is provided between the p-type well 71 and the n-type cathode layer 73. The p-type intermediate layer 77 includes a p-type impurity with a higher concentration than the concentration of the p-type impurity of the p-type well 71. The p-type impurity concentration of the p-type intermediate layer 77 is set so that the diode element 70 has a prescribed breakdown voltage $V_B$. The breakdown voltage $V_B$ of the diode element 70 is less than a drain voltage $V_{DD}$ applied between the drain electrode 20 and the source electrode 30. For example, the breakdown voltage $V_B$ of the diode element 70 is set to 5 V.

As shown in FIG. 1, for example, the inter-layer insulating film 45 extends also in the terminal region TA and covers the insulating film 53 and the resistance element 60. For example, the source electrode 30 has a stacked structure including a first layer 30f, a second layer 30g, and a third layer 30h. For example, the interconnect 33 has a stacked structure including a first layer 33f, a second layer 33g, and a third layer 33h. For example, the interconnect 35 has a stacked structure including a first layer 35f, a second layer 35g, and a third layer 35h.

The first layers 30f, 33f, and 35f include, for example, stacked structures of titanium (Ti) and titanium nitride (TiN). The first layers 30f, 33f, and 35f each provide, for example, the ohmic contact with the semiconductor layers in the semiconductor part 10, and serves as barrier layers impeding the movement of metal atoms into the semiconductor part 10 and the resistance element 60.

Figure 2:
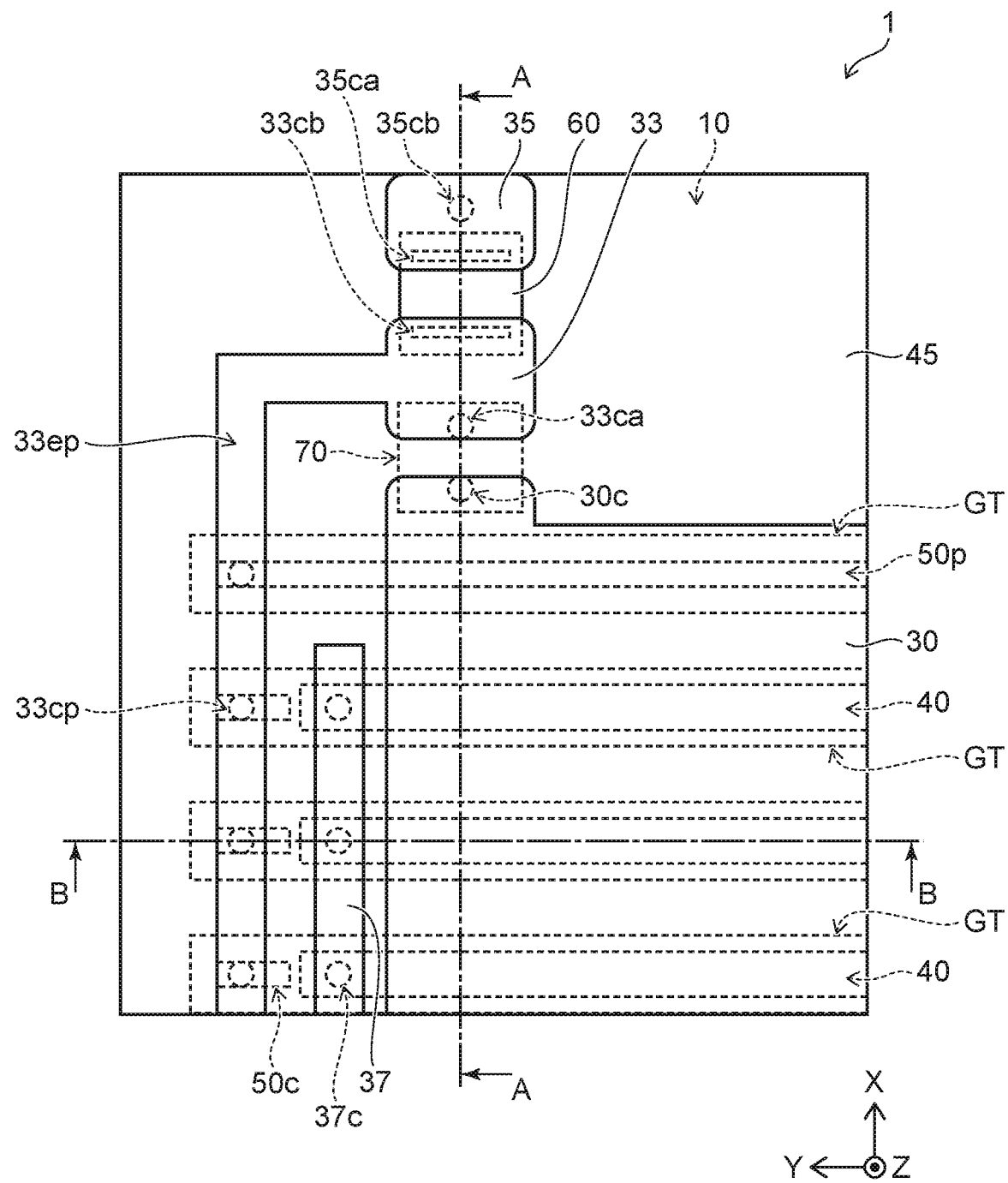
FIG. 2 is a schematic plan view showing the semiconductor device according to the embodiment.

The second layers 30g, 33g, and 35g include, for example, tungsten (W) and fill the contact holes (referring to FIG. 2). The third layers 30h, 33h, and 35h are, for example, metal layers including aluminum (Al) and each have a thickness thicker than the thicknesses of the first layers and the second layers.

The source electrode 30 is provided on the inter-layer insulating film 45 in the terminal region TA. The source electrode 30 includes a portion that extends through the inter-layer insulating film 45 and the insulating film 53 and is electrically connected to the p-type anode layer 75.

The interconnect 33 is provided on the inter-layer insulating film 45 in the terminal region TA. The interconnect 33 includes a portion that extends through the inter-layer insulating film 45 and the insulating film 53 and is electrically connected to the n-type cathode layer 73. The interconnect 33 also includes another portion that extends through the inter-layer insulating film 45 and is electrically connected to the resistance element 60.

The interconnect 35 is provided on the inter-layer insulating film 45 in the terminal region TA. The interconnect 35 includes a portion that extends through the inter-layer insulating film 45 and is electrically connected to the resistance element 60. The interconnect 35 also includes another portion that extends through the inter-layer insulating film 45 and the insulating film 53 and is electrically connected to the n-type contact layer 31.

FIG. 2 is a schematic plan view showing the semiconductor device 1. FIG. 2 is a schematic view showing a portion of the front surface of the semiconductor device 1. FIG. 1 is a schematic view showing a cross section along line A-A shown in FIG. 2.

As shown in FIG. 2, the interconnects 33 and 35, a gate interconnect 37, and the resistance element 60 are provided in the terminal region TA. The interconnect 33 and the gate interconnect 37 are provided apart from the source electrode 30. Also, the interconnect 33 is provided apart from the gate interconnect 37.

The source electrode 30 is provided above the p-type diffusion layer 13 (referring to FIG. 1) and the gate trenches GT. For example, the source electrode 30 includes a portion provided above the diode element 70 and is electrically connected to the p-type anode layer 75 of the diode element 70 via a contact hole 30c (referring to FIG. 1).

For example, the gate trench GT extends in the Y-direction in the X-Y plane. The gate electrode 40 extends in the extension direction (the Y-direction) of the gate trench GT. The gate electrode 40 is provided below the source electrode 30 and extends outward of the outer edge of the source electrode 30.

The gate electrode 40 is electrically connected to the gate interconnect 37 at the extended end thereof. For example, the gate interconnect 37 is connected to the gate electrode 40 via a contact hole 37c provided in the inter-layer insulating film 45 (referring to FIG. 3).

The interconnect 33 includes a portion connected to the resistance element 60 and another portion provided above the diode element 70. The interconnect 33 is electrically connected to the n-type cathode layer 73 of the diode element 70 via a contact hole 33ca provided in the inter-layer insulating film 45 and the insulating film 53 (referring to FIG. 1). Also, the interconnect 33 is electrically connected to the resistance element 60 via a contact hole 33cb provided in the inter-layer insulating film 45 (referring to FIG. 1).

The interconnect 33 includes an extension portion 33ep extending along the upper surface of the inter-layer insulating film 45. The FP electrode 50 includes a connection portion 50c provided between the end portion of the gate electrode 40 and the end of the gate trench GT. The extension portion 33ep extends over the connection portion 50c of the FP electrode 50. The extension portion 33ep is electrically connected to the connection portion 50c of the FP electrode 50 via a contact hole 33cp provided in the inter-layer insulating film 45 (referring to FIG. 3).

The extension portion 33*ep* of the interconnect 33 is electrically connected also to the FP electrode 50*p* via the contact hole 33*cp* provided in the inter-layer insulating film 45. The FP electrode 50*p* is disposed inside the gate trench GT that is provided at the boundary between the active region AA and the terminal region TA.

The interconnect 35 is provided apart from the interconnect 33. The interconnect 35 includes a portion connected to the resistance element 60. The interconnect 35 is electrically connected to the resistance element 60 via a contact hole 35*ca* provided in the inter-layer insulating film 45 (referring to FIG. 1). Also, the interconnect 35 is electrically connected to the n-type contact layer 31 of the semiconductor part 10 via a contact hole 35*cb* provided in the inter-layer insulating film 45 and the insulating film 53 (referring to FIG. 1).

Figure 3:
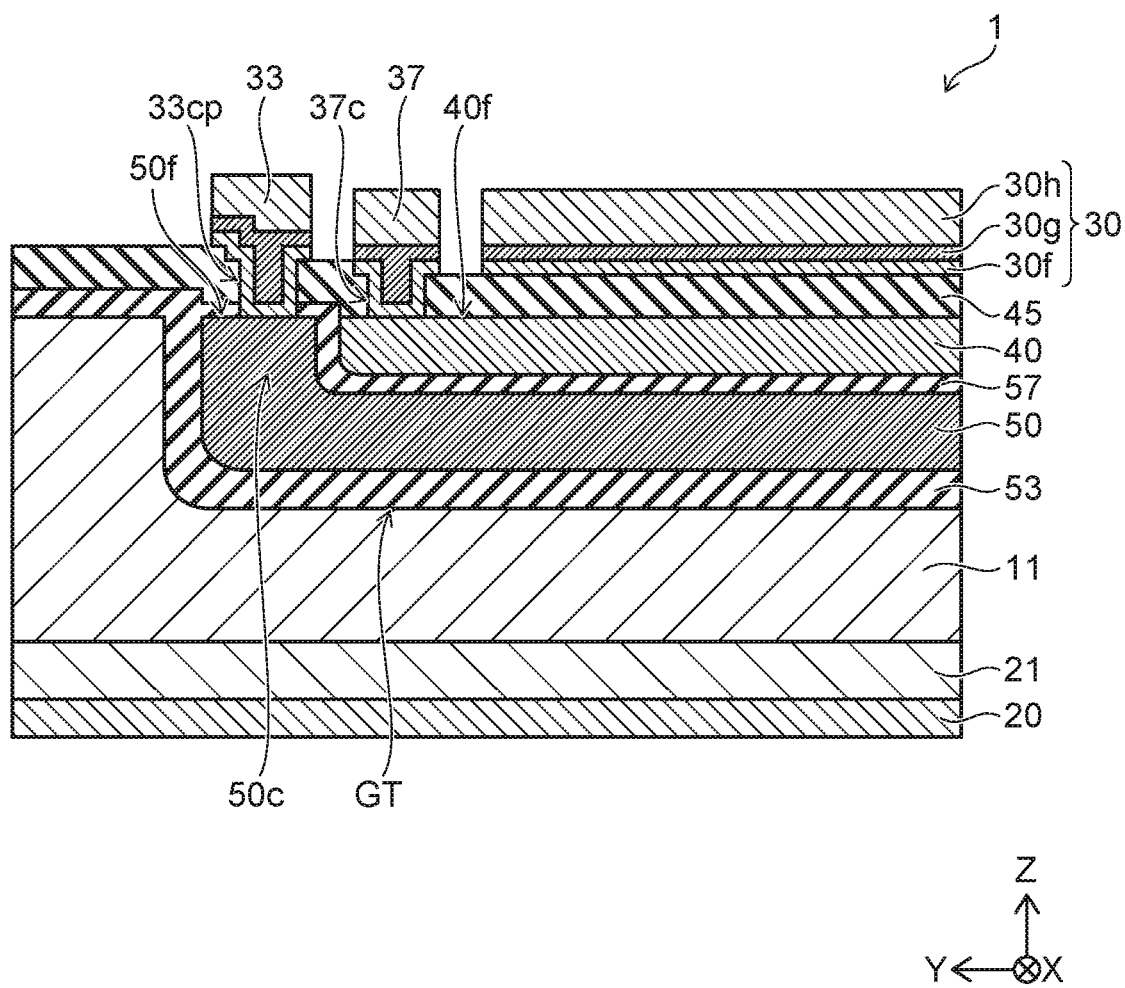
FIG. 3 is a schematic cross-sectional view showing an interconnect structure of the semiconductor device according to the embodiment.

FIG. 3 is a schematic cross-sectional view showing the interconnect structure of the semiconductor device 1 according to the embodiment. FIG. 3 is a schematic view showing a cross section along line B-B shown in FIG. 2.

The gate electrode 40 is electrically insulated from the source electrode 30 by the inter-layer insulating film 45. The gate electrode 40 is electrically connected to the gate interconnect 37 via the contact hole 37*c* provided in the inter-layer insulating film 45. For example, the gate interconnect 37 has the same stacked structure as the stacked structures of the source electrode 30, the interconnect 33, and the interconnect 35.

The FP electrode 50 extends in, for example, the Y-direction along the gate electrode 40. The FP electrode 50 is electrically insulated from the gate electrode 40 by the insulating film 57. The FP electrode 50 includes the connection portion 50*c* extending between the end of the gate trench GT and the end of the gate electrode 40.

The connection portion 50*c* of the FP electrode 50 has an upper surface 50*f* positioned at, for example, the same level in the Z-direction as an upper surface 40*f* of the gate electrode 40. For example, the interconnect 33 is connected to the upper surface 50*f* of the connection portion 50*c* via the contact hole 33*cp* provided in the inter-layer insulating film 45 and the insulating film 57.

Figure 4:
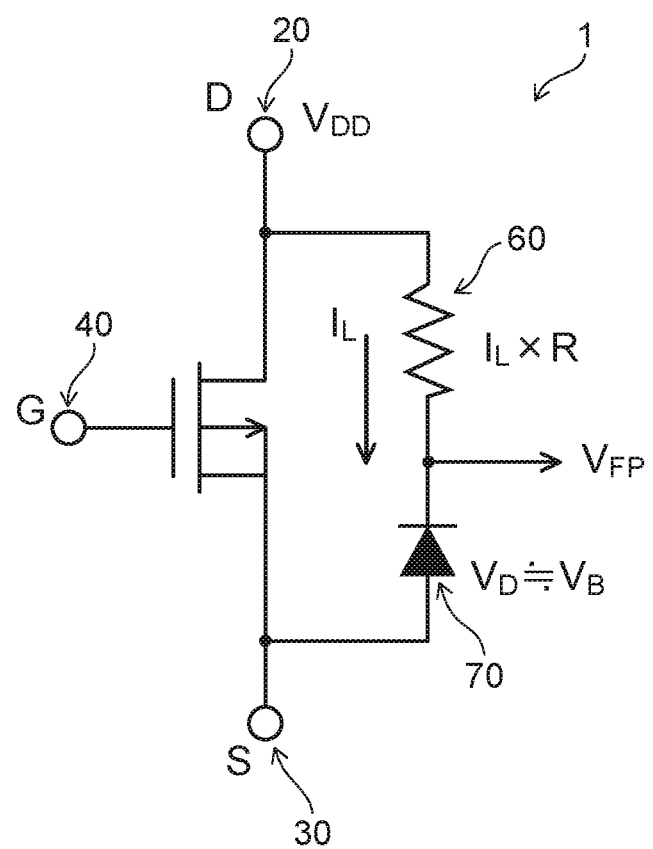
FIG. 4 is a circuit diagram of the semiconductor device according to the embodiment.

FIG. 4 is a circuit diagram of the semiconductor device 1. As shown in FIG. 4, the resistance element 60 and the diode element 70 are connected in series between the drain electrode 20 and the source electrode 30.

The diode element 70 is provided to have a rectifying property reverse to the flowing direction of a leakage current $I_L$ that flows from the drain electrode 20 to the source electrode 30 via the resistance element 60. The leakage current via the resistance element 60 between the drain electrode 20 and the source electrode 30 is blocked by the diode element 70. The drain voltage $V_{DD}$ that is applied between the drain electrode 20 and the source electrode 30 is split by the resistance element 60 and the diode element 70, and an intermediate voltage $V_{FP}$ is supplied to the FP electrode 50 via the interconnect 33. It is preferable for the resistance element 60 to have a high resistance to reduce the leakage current $I_L$.

For example, the breakdown voltage $V_B$ in the reverse direction of the diode element 70 is set to be less than the drain voltage $V_{DD}$. When a voltage $V_D$ of the diode element 70 is less than the breakdown voltage $V_B$, the leakage current $I_L$ is suppressed, and the voltage drop $I_L \times R$ of the resistance element 60 is small. Therefore, the voltage $V_D$ of the diode element 70 increases and approaches the breakdown voltage $V_B$. For example, when the voltage $V_D$ of the diode element 70 becomes the breakdown voltage $V_B$, the leakage current $I_L$ increases by the reverse breakdown of the diode element 70. At this time, the voltage drop of the resistance element 60 increases and the voltage $V_D$ of the diode element 70 is reduced. As a result, the voltage $V_D$ of the diode element 70 has a stable value near the breakdown voltage $V_B$.

The voltage $V_{FP}$ that is near the breakdown voltage $V_B$ of the diode element 70 is supplied to the FP electrode 50 of the semiconductor device 1. For example, when the drain voltage $V_{DD}$ is 60 V, the breakdown voltage $V_B$ of the diode element 70 is set to about 5 V.

For example, when a positive voltage is applied between the source electrode 30 and the FP electrode 50, the electric field at the bottom portion of the gate trench GT is reduced, and the electric field is increased at the vicinity of the p-n junction between the n-type drift layer 11 and the p-type diffusion layer 13. In other words, setting the FP electrode 50 to have the same potential as the potential of the source electrode 30 provides the same effect as increasing the thickness of the insulating film 53 between the n-type drift layer 11 and the FP electrode 50. Accordingly, if a positive voltage is applied between the source electrode 30 and the FP electrode 50, the insulating film 53 may be thinner while maintaining the insulation breakdown voltage between the n-type drift layer 11 and the FP electrode 50.

For example, by reducing the film thickness of the insulating film 53, it is possible to reduce the distance between the adjacent gate trenches GT. Thus, the ON-resistance can be reduced by increasing the density of the integrated gate trench GT.

Figure 5:
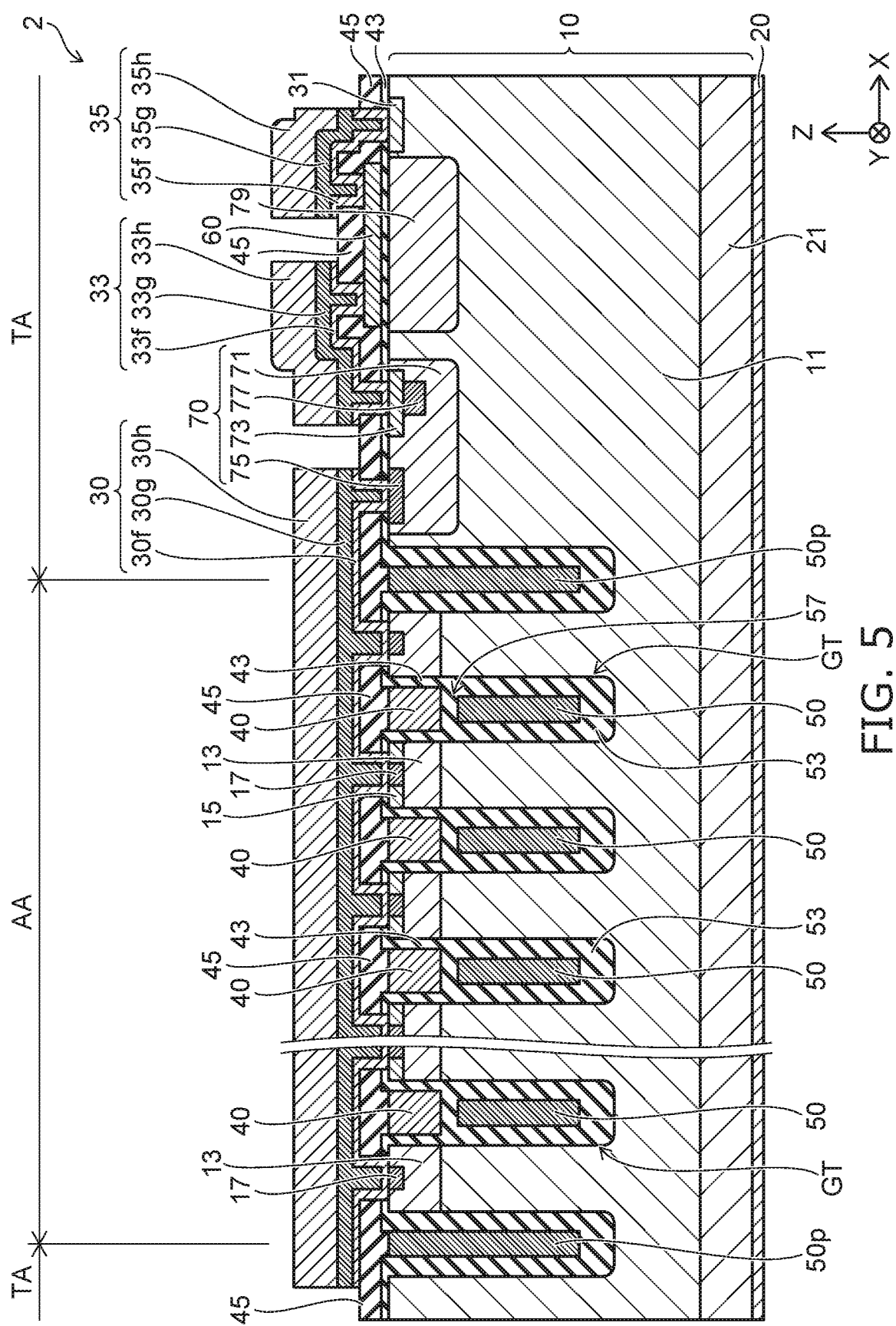
FIG. 5 is a schematic cross-sectional view showing a semiconductor device according to a first modification of the embodiment.

FIG. 5 is a schematic cross-sectional view showing a semiconductor device 2 according to a first modification of the embodiment. The semiconductor device 2 is, for example, a MOS transistor having a trench gate structure. The semiconductor device 2 includes the resistance element 60 and the diode element 70.

In the semiconductor device 2, instead of the insulating film 53 (referring to FIG. 1), the insulating film 43 extends into the terminal region TA and covers the front surface of the semiconductor part 10. The resistance element 60 is provided on the insulating film 43. The inter-layer insulating film 45 covers the insulating film 43 and the resistance element 60 in the terminal region TA.

The insulating film 43 is provided as a gate insulating film positioned between the p-type diffusion layer 13 and the gate electrode 40. Therefore, the film thickness of the insulating film 43 is less than the film thickness of the insulating film 53. In the example, a p-type well 79 is provided below the resistance element 60 to increase the insulation breakdown voltage between the n-type drift layer 11 and the resistance element 60. The p-type well 79 is not only applicable to this example, and may be applied to the other examples.

Figure 6:
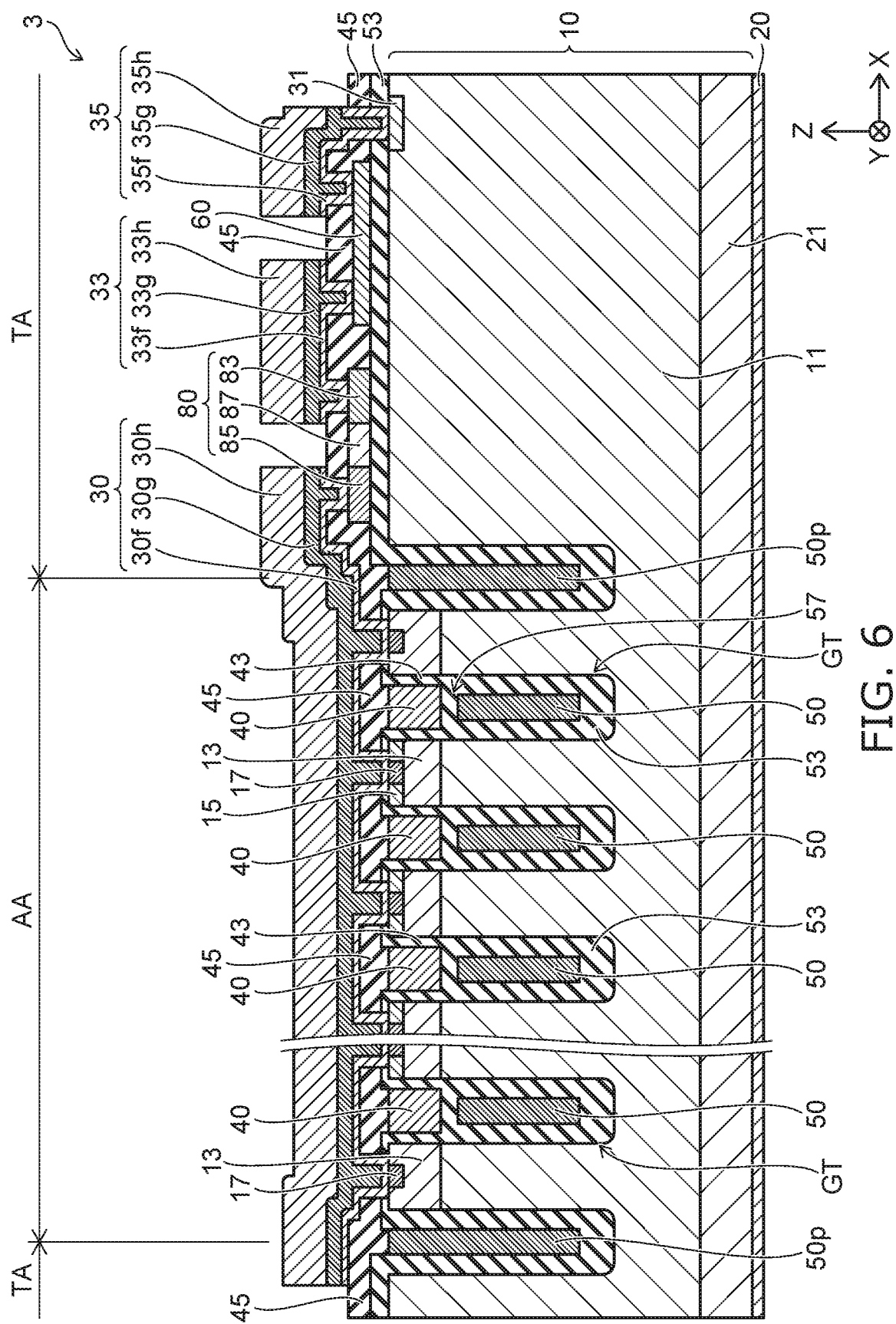
FIG. 6 is a schematic cross-sectional view showing a semiconductor device according to a second modification of the embodiment.

FIG. 6 is a schematic cross-sectional view showing a semiconductor device 3 according to a second modification of the embodiment. The semiconductor device 3 is, for example, a MOS transistor having a trench gate structure. The semiconductor device 3 includes the resistance element 60 and a diode element 80. The diode element 80 is connected in series to the resistance element 60 via the interconnect 33.

As shown in FIG. 6, the resistance element 60 and the diode element 80 are provided on the insulating film 53 covering the front surface of the semiconductor part 10 in the terminal region TA. The diode element 80 includes an n-type cathode layer 83, a p-type anode layer 85, and a p-type intermediate layer 87. The inter-layer insulating film 45 covers the resistance element 60 and the diode element 80.

The n-type cathode layer 83, the p-type anode layer 85, and the p-type intermediate layer 87 are arranged along the upper surface of the insulating film 53. The p-type intermediate layer 87 is provided between the n-type cathode layer 83 and the p-type anode layer 85. For example, the p-type intermediate layer 87 is connected to the n-type cathode layer 83 and the p-type anode layer 85. The n-type cathode layer 83, the p-type anode layer 85, and the p-type intermediate layer 87 are, for example, polysilicon layers.

The n-type cathode layer 83 is electrically connected to the resistance element 60 via the interconnect 33. The p-type anode layer 85 is electrically connected to the source electrode 30.

For example, the p-type intermediate layer 87 includes a p-type impurity with a lower concentration than the concentration of the p-type impurity in the p-type anode layer 85. The p-type impurity concentration of the p-type intermediate layer 87 is set so that the breakdown voltage $V_B$ of the diode element 80 is less than the drain voltage $V_{DD}$. The p-type impurity concentration of the p-type intermediate layer 87 is set so that the breakdown voltage $V_B$ of the diode element 80 is, for example, 5 V. An n-type intermediate layer may be provided instead of the p-type intermediate layer 87. In such a case, the n-type intermediate layer includes an n-type impurity with a lower concentration than the concentration of the n-type impurity in the n-type cathode layer 83.

In the example, one p-n junction is formed between the n-type cathode layer 83 and the p-type intermediate layer 87. The embodiment is not limited to the example; for example, the diode element 80 may have a structure in which multiple p-n junctions are connected in series along the upper surface of the insulating film 53. The diode element 70 shown in FIG. 1 also may have a structure in which multiple p-n junctions are connected in series.

Figure 7:
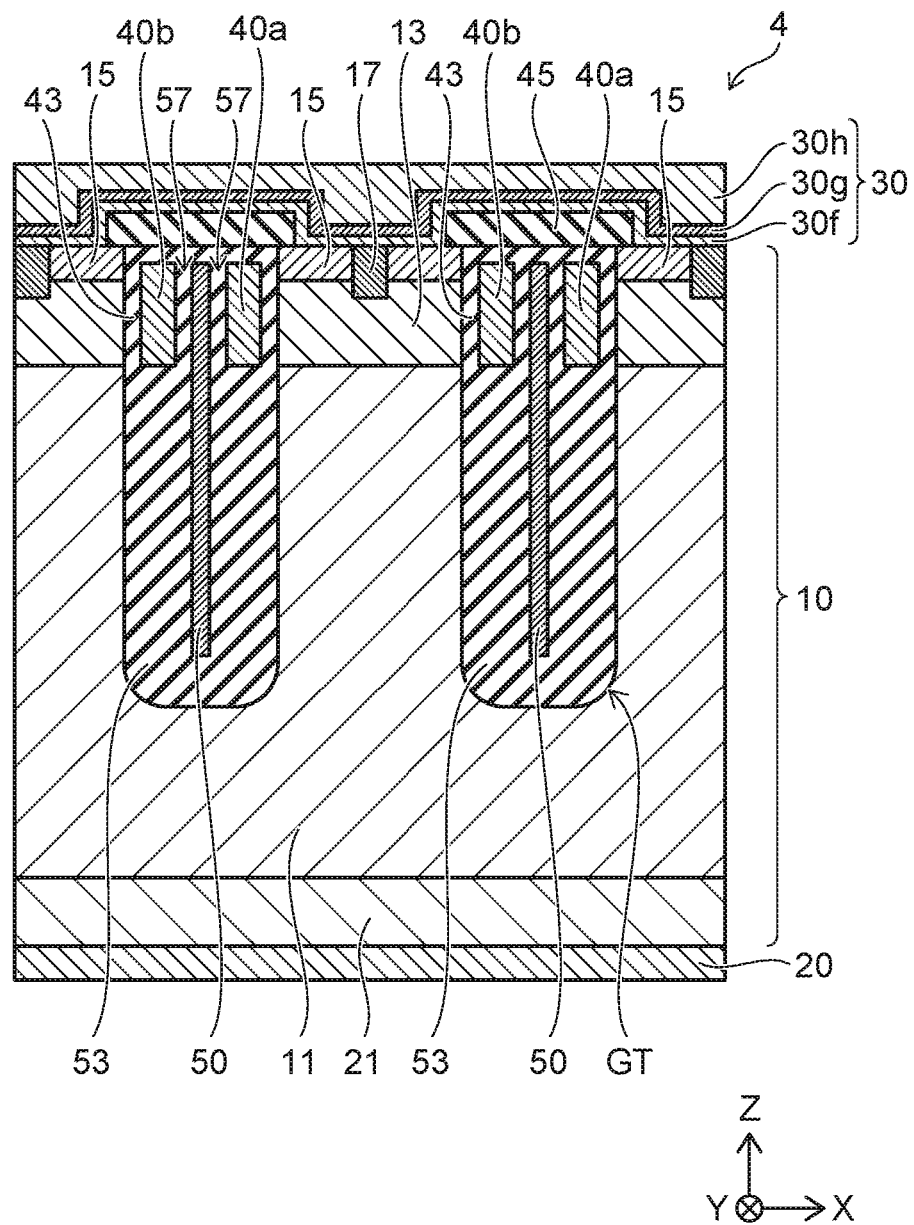
FIG. 7 is a schematic cross-sectional view showing a semiconductor device according to a third modification of the embodiment.

FIG. 7 is a schematic cross-sectional view showing a semiconductor device 4 according to a third modification of the embodiment. FIG. 7 is a schematic view showing the structure of the trench gate provided in the active region AA.

The semiconductor device 4 includes gate electrodes 40a and 40b and the FP electrode 50. The gate electrodes 40a and 40b and the FP electrode 50 are disposed inside one gate trench GT.

As shown in FIG. 7, the gate electrodes 40a and 40b each face the p-type diffusion layer 13 via the insulating film 43.

For example, the FP electrode 50 is provided at a position more proximate to the drain electrode 20 than the gate electrode 40a or 40b. The FP electrode 50 includes a portion extending between the gate electrode 40a and the gate electrode 40b.

The FP electrode 50 is provided apart from the gate electrode 40a and the gate electrode 40b. The FP electrode 50 is electrically insulated from the gate electrode 40a and the gate electrode 40b by the insulating film 57. The FP electrode 50 is electrically connected to the interconnect 33 and supplied with the potential between the resistance element 60 and the diode element 70 or 80.

Also, in this example, the insulating film 53 provided between the n-type drift layer 11 and the FP electrode 50 may have a film thickness decreased to reduce the ON-resistance.

Figure 8:
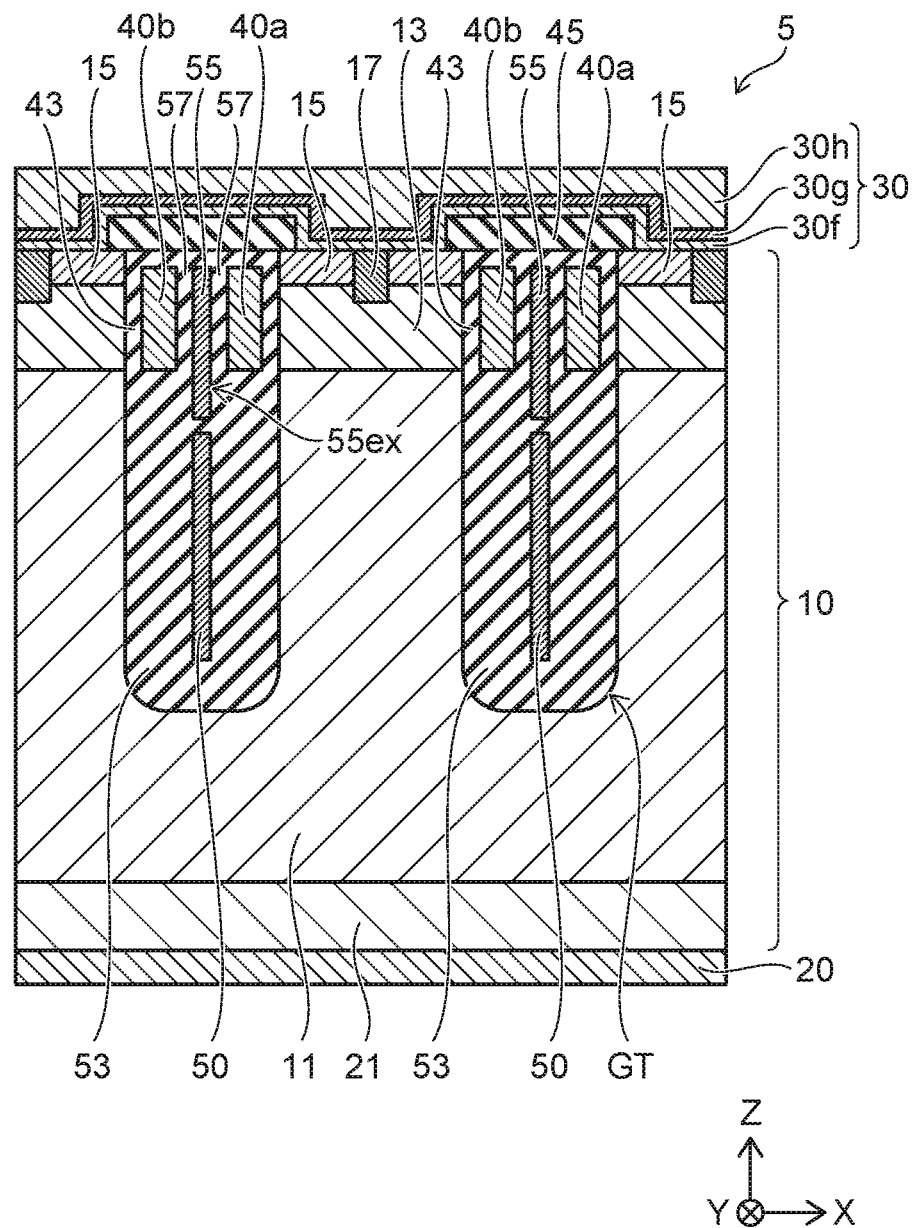
FIG. 8 is a schematic cross-sectional view showing a semiconductor device according to a fourth modification of the embodiment.

FIG. 8 is a schematic cross-sectional view showing a semiconductor device 5 according to a fourth modification of the embodiment. FIG. 8 is a schematic view showing the structure of the trench gate provided in the active region AA.

The semiconductor device 5 includes the gate electrodes 40a and 40b, the FP electrode 50, and an intermediate electrode 55. The gate electrodes 40a and 40b, the FP electrode 50, and the intermediate electrode 55 are provided inside one gate trench GT.

As shown in FIG. 8, the gate electrodes 40a and 40b each face the p-type diffusion layer 13 via the insulating film 43. The intermediate electrode 55 is provided between the gate electrode 40a and the gate electrode 40b. The intermediate electrode 55 includes an extension portion 55ex extending toward the drain electrode 20. The FP electrode 50 is provided between the drain electrode 20 and the intermediate electrode 55.

In the semiconductor device 5, the FP electrode 50 is electrically connected to the source electrode 30, and the intermediate electrode 55 is electrically connected to the interconnect 33. In other words, in the example, the intermediate voltage $V_{FP}$ between the resistance element 60 and the diode element 70 or 80 is supplied to the intermediate electrode 55.

For example, by supplying the voltage $V_{FP}$ to the intermediate electrode 55, the electric field intensity can be changed in the insulating film 53 between the n-type drift layer 11 and the extension portion 55ex. The electric field distribution can be changed along the boundary between the n-type drift layer 11 and the insulating film 53, thereby, making the breakdown voltage of the semiconductor device 5 increase in the OFF-state.

Figure 9A:
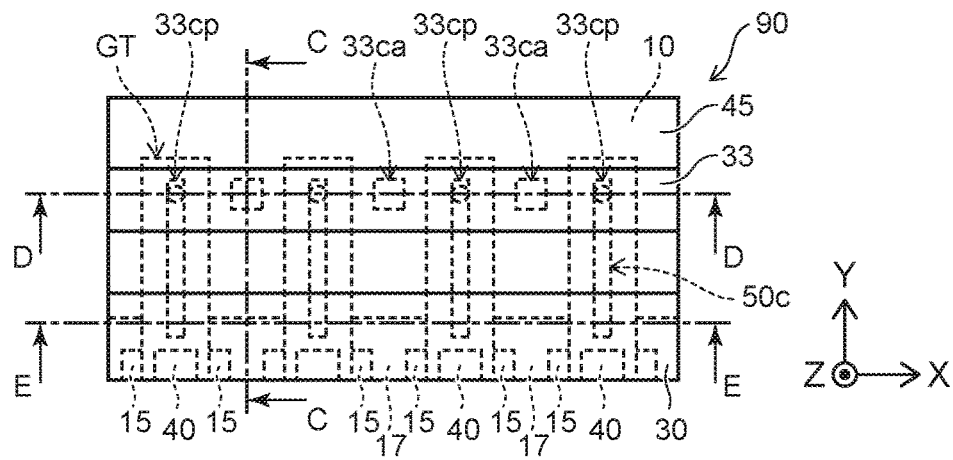
FIGS. 9A to 9D are schematic views showing a diode element of a semiconductor device according to a modification of the embodiment.

FIGS. 9A to 9D are schematic views showing a diode element 90 of a semiconductor device according to a modification of the embodiment. FIG. 9A is a schematic plan view showing the arrangement of the source electrode 30 and the interconnect 33 on the front surface of the semiconductor part 10.

Figure 9B:
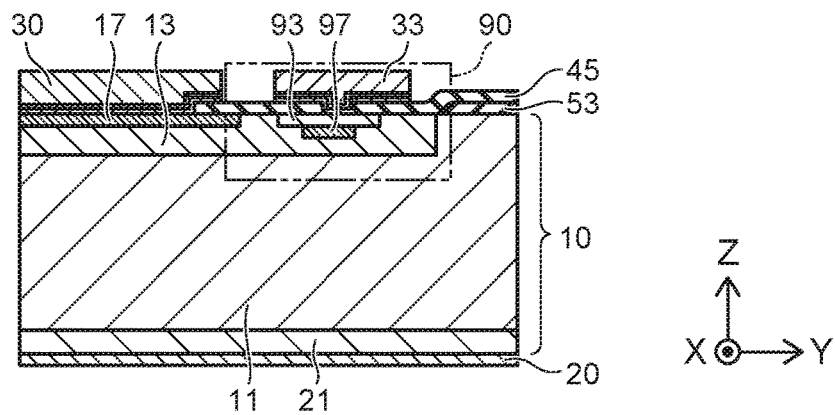

FIG. 9B is a cross-sectional view along line C-C shown in FIG. 9A.

Figure 9C:
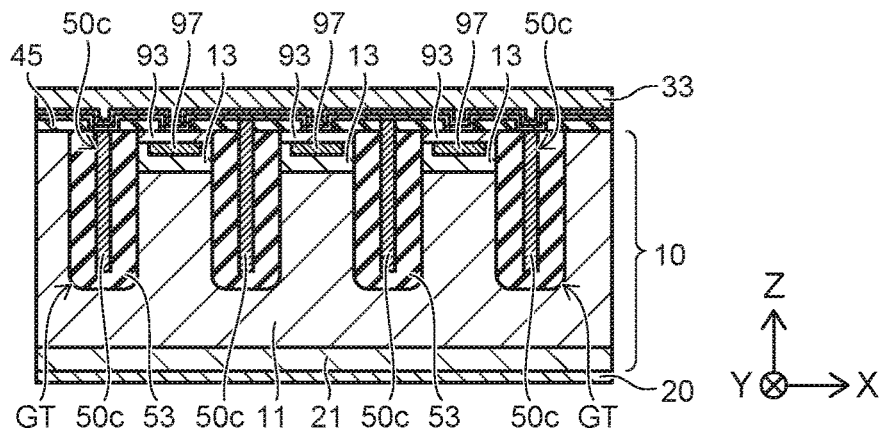

FIG. 9C is a cross-sectional view along line D-D shown in FIG. 9A.

Figure 9D:
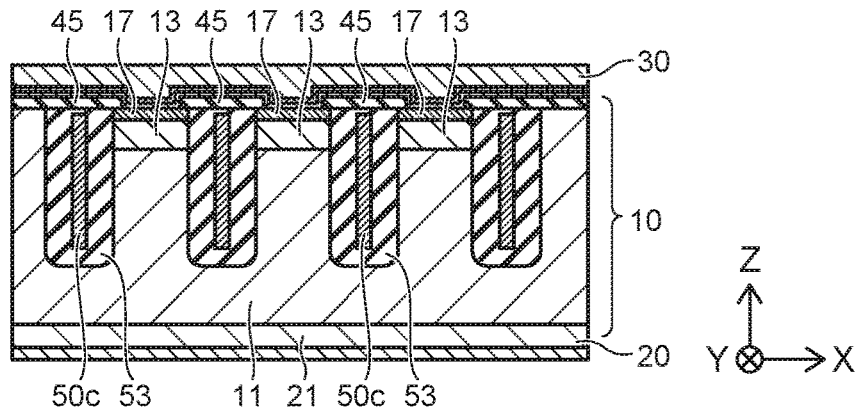

FIG. 9D is a cross-sectional view along line E-E shown in FIG. 9A.

As shown in FIG. 9A, the interconnect 33 is provided apart from the source electrode 30. The interconnect 33 extends in the X-direction along the source electrode 30. The interconnect 33 is provided above the connection portion 50c of the FP electrode 50 and is electrically connected to the connection portion 50c of the FP electrode 50 via the contact hole 33cp (referring to FIG. 3). Also, the interconnect 33 is electrically connected to the resistance element 60 positioned at a portion not-illustrated.

As shown in FIG. 9B, the diode element 90 includes a portion of the p-type diffusion layer 13, a portion of the p-type contact layer 17, an n-type cathode layer 93, and a p-type intermediate layer 97. The diode element 90 is provided in the region surrounded with the double dot-dash line in FIG. 9B.

The n-type cathode layer 93 is provided between the p-type diffusion layer 13 and the interconnect 33. The p-type intermediate layer 97 is provided between the p-type diffusion layer 13 and the n-type cathode layer 93. The p-type intermediate layer 97 includes a p-type impurity with a higher concentration than the concentration of the p-type impurity in the p-type diffusion layer 13. The portion of the p-type contact layer 17 serves as a p-type anode layer.

The diode element 90 is electrically connected to the source electrode 30 via the p-type diffusion layer 13 and the p-type contact layer 17. In the diode element 90, the portion of the p-type contact layer 17 serves as the anode layer.

As shown in FIG. 9C, for example, the diode element 90 is provided between the gate trenches GT adjacent to each other in the X-direction. The interconnect 33 is electrically connected to the n-type cathode layer 93 via the contact hole 33ca (referring to FIG. 9A). Also, the interconnect 33 is connected to the connection portion 50c of the FP electrode 50 via the contact hole 33cp.

As shown in FIG. 9D, the p-type diffusion layer 13 is electrically connected to the source electrode 30 via the p-type contact layer 17. The gate electrode 40 is not provided in the portion of the gate trench GT adjacent to the diode element 90. Also, the n-type source layer 15 is not provided in the portion of the semiconductor part 10 where the diode element 90 is provided.

Figure 10:
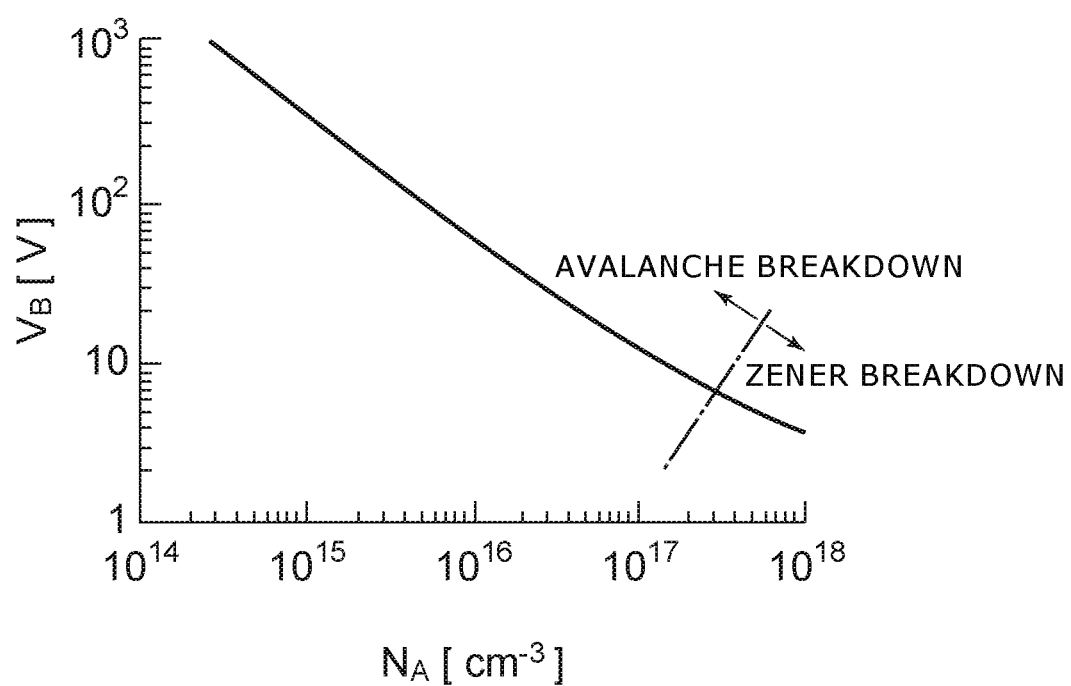
FIG. 10 is a graph illustrating a diode characteristic of the diode element according to the embodiment.

FIG. 10 is a graph illustrating a diode characteristic of the diode elements 70, 80, and 90 according to the embodiments (reference: Makoto Konagai, "Semiconductor Properties", published by Baifukan Co., Ltd.). The vertical axis is the breakdown voltage $V_B$, and the horizontal axis is a p-type impurity concentration $N_A$ of the p-type intermediate layers 77, 87, and 97.

As shown in FIG. 10, the breakdown voltage $V_B$ decreases as the p-type impurity concentration "$N_A$" increases. For example, when the semiconductor part 10 is silicon, the breakdown mode of the diode changes at a boundary in the concentration range of $N_A = 2 \times 10^{17}$ to $4 \times 10^{17}$ cm$^{-3}$. For example, the avalanche breakdown is dominant when $N_A$ is less than $2 \times 10^{17}$ cm$^{-3}$, and the Zener breakdown is dominant when $N_A$ is greater than $4 \times 10^{17}$ cm$^{-3}$.

For example, the breakdown voltage $V_B$ due to avalanche breakdown has a positive temperature dependence. In other words, the breakdown voltage $V_B$ increases as the temperature increases. On the other hand, the breakdown voltage $V_B$ due to Zener breakdown has a negative temperature dependence and decreases as the temperature increases. Accordingly, the temperature dependence of the breakdown voltage $V_B$ may be suppressed by setting the p-type impurity concentration "$N_A$" of the p-type intermediate layers 77, 87, and 97 to be in a region between the concentration region in which the avalanche breakdown is dominant and the concentration region in which the Zener breakdown is dominant. Thereby, the voltage $V_{FP}$ that is applied to the FP electrode 50 (referring to FIG. 4) may be stabilized. When the semiconductor part 10 is silicon, for example, the p-type impurity concentration "$N_A$" of the p-type intermediate layers 77, 87, and 97 is preferably set to a concentration range of $2 \times 10^{17}$ to $4 \times 10^{17}$ cm$^{-3}$.

Figure 11A:
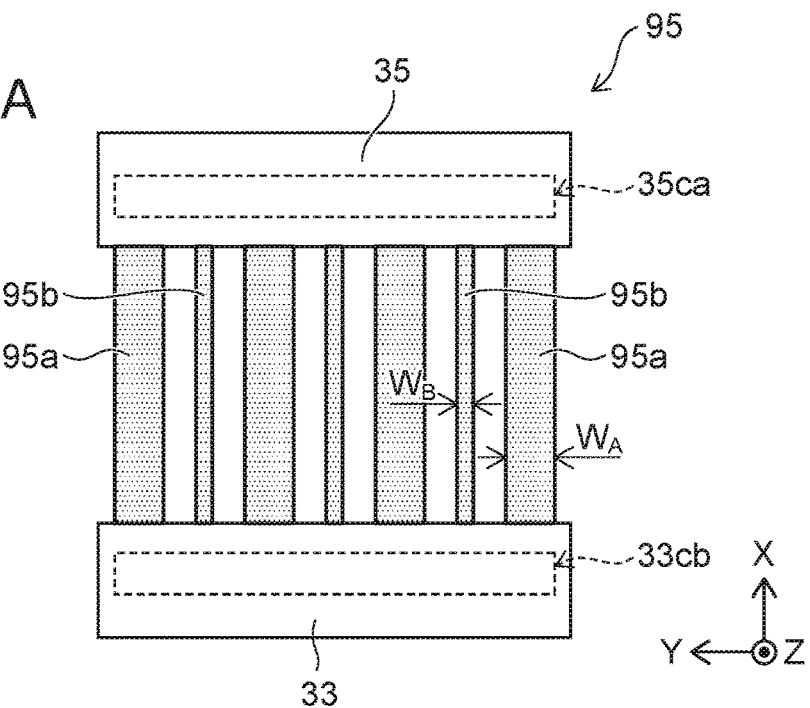
FIGS. 11A to 11C are schematic views showing a resistance element of a semiconductor device according to a modification of the embodiment.
Figure 11B:
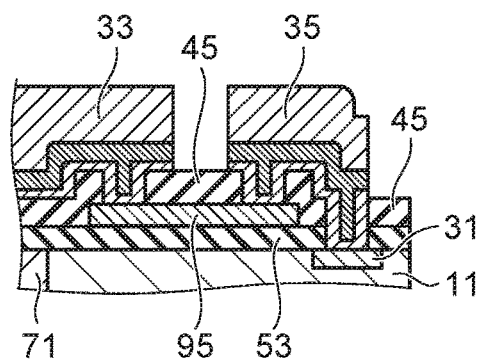
Figure 11C:
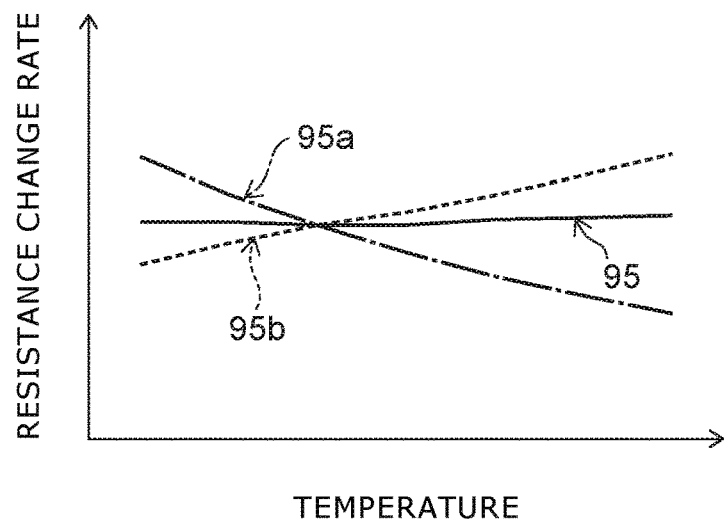

FIGS. 11A to 11C are schematic views showing a resistance element 95 of a semiconductor device according to a modification of the embodiment. FIG. 11A is a schematic plan view showing the resistance element 95. FIG. 11B is a schematic view showing a cross section in which the resistance element 95 is provided instead of the resistance element 60. FIG. 11C is a graph showing temperature characteristics of the resistance element 95.

As shown in FIG. 11A, the resistance element 95 includes a first resistance portion 95a and a second resistance portion 95b. For each of the first resistance portion 95a and the second resistance portion 95b, one end portion is electrically connected to the interconnect 33, and the other end portion is electrically connected to the interconnect 35. The first resistance portion 95a and the second resistance portion 95b are arranged in parallel between the interconnect 33 and the interconnect 35.

For example, the first resistance portion 95a is of a p-type conductivity and is formed by selectively ion-implanting boron (B) into a high-resistance polysilicon layer. The resistivity of the first resistance portion 95a is, for example, 400 Ωcm$^{-2}$.

For example, the second resistance portion 95b is of an n-type conductivity and is formed by diffusing phosphorus (P) into a high-resistance polysilicon layer. The resistivity of the second resistance portion 95b is, for example, 10 Ωcm$^{-2}$.

A width $W_A$ in the Y-direction of the first resistance portion 95a is wider than a width $W_B$ in the Y-direction of the second resistance portion 95b. For example, the first resistance portion 95a and the second resistance portion 95b are provided to have about the same resistance between the interconnect 33 and the interconnect 35.

As shown in FIG. 11B, for example, the resistance element 95 extends in the X-direction along the upper surface of the inter-layer insulating film 53. For example, the resistance element 95 has a structure in which the first resistance portion 95a and the second resistance portion 95b are selectively provided inside a high-resistance polysilicon layer on the inter-layer insulating film 53.

FIG. 11C shows temperature characteristics of the first resistance portion 95a, the second resistance portion 95b, and the resistance element 95. The horizontal axis is the temperature, and the vertical axis is the resistance change rate.

As shown in FIG. 11C, the first resistance portion 95a has a negative temperature dependence, and the second resistance portion 95b has a positive temperature dependence. By arranging the first resistance portion 95a and the second resistance portion 95b in parallel, the resistance element 95 has a temperature characteristic in which the two temperature dependencies cancel. In other words, in the resistance element 95, the change of the resistivity with the temperature is suppressed. Accordingly, when the temperature changes, the change of the voltage $V_{FP}$ applied to the FP electrode 50 (referring to FIG. 4) can be suppressed by using the resistance element 95 instead of the resistance element 60.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor part;
   a first electrode provided on a back surface of the semiconductor part;
   a second electrode provided on a front surface of the semiconductor part;
   a control electrode provided between the second electrode and the semiconductor part inside a trench of the semiconductor part, the control electrode being electrically insulated from the semiconductor part by a first insulating portion inside the trench, the control electrode being electrically insulated from the second electrode by a second insulating portion between the control electrode and the second electrode;
   a third electrode provided inside the trench, the third electrode being provided more proximate to the first electrode than the control electrode, the third electrode being electrically insulated from the semiconductor part by a third insulating portion inside the trench, the third electrode being electrically insulated from the control electrode by a fourth insulating portion between the third electrode and the control electrode;
a diode element provided at the front surface of the semiconductor part and electrically connected to the second electrode;
a resistance element provided on an insulating film covering the front surface of the semiconductor part, the resistance element being connected in series to the diode element;
a first interconnect electrically connecting the diode element and the resistance element, the first interconnect being electrically connected to the third electrode; and
a second interconnect electrically connecting the resistance element and the semiconductor part,
the semiconductor part including a first semiconductor layer of a first conductivity type, a second semiconductor layer of a second conductivity type, and a third semiconductor layer of the first conductivity type,
the first semiconductor layer being provided between the first electrode and the second electrode, between the first electrode and the diode element, and between the first electrode and the resistance element, the first semiconductor layer being electrically connected to the resistance element via the second interconnect,
the second semiconductor layer being provided between the first semiconductor layer and the second electrode, the second semiconductor layer facing the control electrode via the first insulating portion,
the third semiconductor layer being selectively provided between the second semiconductor layer and the second electrode, provided at a position contacting the first insulating portion, and electrically connected to the second electrode,
the diode element being provided to have a rectifying property reverse to a current direction flowing from the resistance element to the second electrode.

2. The device according to claim 1, wherein
the diode element includes a fourth semiconductor layer of the second conductivity type, a fifth semiconductor layer of the first conductivity type, and a sixth semiconductor layer of the second conductivity type;
the fourth semiconductor layer is provided inside the semiconductor part, the fourth semiconductor layer being electrically connected to the second electrode;
the fifth semiconductor layer is provided inside the fourth semiconductor layer, the fifth semiconductor layer being electrically connected to the first interconnect; and
the sixth semiconductor layer is provided between the fourth semiconductor layer and the fifth semiconductor layer, the sixth semiconductor layer including a second-conductivity-type impurity with a higher concentration than a concentration of a second-conductivity-type impurity in the fourth semiconductor layer.

3. The device according to claim 2, wherein
the insulating film covers the diode element on the front surface of the semiconductor part;
the first interconnect is provided on the insulating film, the first interconnect including a contact portion extending into the insulating film to contact the fifth semiconductor layer; and
the fifth semiconductor layer is electrically connected to the first interconnect via the contact portion.

4. The device according to claim 3, wherein
the diode element further includes a seventh semiconductor layer of the second conductivity type provided between the fourth semiconductor layer and the insulating film, the seventh semiconductor layer being provided apart from the fifth semiconductor layer, the seventh semiconductor layer including a second-conductivity-type impurity with a higher concentration than the concentration of the second-conductivity-type impurity in the fourth semiconductor layer;
the second electrode includes a contact portion extending into the insulating film, the contact portion contacting the seventh semiconductor layer; and
the fourth semiconductor layer is electrically connected to the second electrode via the seventh semiconductor layer.

5. The device according to claim 2, wherein
the semiconductor part further includes an eighth semiconductor layer of the second conductivity type provided between the first semiconductor layer and the resistance element, the eighth semiconductor layer being provided apart from the diode element; and
the insulating film extends between the resistance element and the eighth semiconductor layer.

6. The device according to claim 1, wherein
the diode element includes, a fifth semiconductor layer of the first conductivity type, a sixth semiconductor layer of the second conductivity type, and a ninth semiconductor layer provided between the fifth semiconductor layer and the sixth semiconductor layer, the fifth, sixth and ninth semiconductor layers being provided on the insulating film;
the fifth semiconductor layer is electrically connected to the first interconnect;
the sixth semiconductor layer is electrically connected to the second electrode; and
the ninth semiconductor layer contacts the fifth semiconductor layer and the sixth semiconductor layer, the ninth semiconductor layer includes a first-conductivity-type impurity with a lower concentration than a concentration of a first-conductivity-type impurity in the fifth semiconductor layer or includes a second-conductivity-type impurity with a lower concentration than a concentration of a second-conductivity-type impurity in the sixth semiconductor layer.

7. The device according to claim 1, wherein
the first interconnect and the second interconnect are provided on the insulating film, the first and second interconnects including contact portions contacting the resistance element; and
the second interconnect further includes an other contact portion extending into the insulating film, the other contact portion being electrically connected to the first semiconductor layer of the semiconductor part.

8. The device according to claim 7, wherein
the semiconductor part further includes a tenth semiconductor layer of the first conductivity type provided between the first semiconductor layer and the other contact portion of the second interconnect, the tenth semiconductor layer including a first-conductivity-type impurity with a higher concentration than a concentration of a first-conductivity-type impurity in the first semiconductor layer;
the second interconnect has the other contact portion contacting the tenth semiconductor layer; and
the first semiconductor layer is electrically connected to the second interconnect via the tenth semiconductor layer.

9. The device according to claim 1, wherein
the third electrode is provided between the first electrode and the control electrode, the third electrode facing the first semiconductor layer of the semiconductor part via the third insulating portion.

10. The device according to claim 1, wherein
the third electrode includes a first portion and a second portion arranged in a direction from the first electrode toward the second electrode, the first portion facing the first semiconductor layer of the semiconductor part via the third insulating portion, the second portion facing the control electrode via the fourth insulating portion, and
the control electrode is positioned between the second semiconductor layer of the semiconductor part and the second portion of the third electrode.

11. The device according to claim 10, further comprising:
a fourth electrode provided between the first electrode and the third electrode inside the trench, the fourth electrode being electrically connected to the second electrode, the fourth electrode facing the first semiconductor layer of the semiconductor part via a fifth insulating portion, the fourth electrode being electrically insulated from the semiconductor part by the fifth insulating portion.

12. The device according to claim 1, wherein
the sixth semiconductor layer of the diode element includes a second-conductivity-type impurity with a concentration between a first impurity concentration at which avalanche breakdown is dominant and a second impurity concentration at which Zener breakdown is dominant.

13. The device according to claim 1, wherein
the second semiconductor layer includes an extension portion extending outward beyond the second electrode in a direction along the front surface of the semiconductor part; and
the diode element includes the extension portion of the second semiconductor layer, a fifth semiconductor layer of the first conductivity type, and a sixth semiconductor layer of the second conductivity type,
the extension portion being provided between the first semiconductor layer and the first interconnect,
the fifth semiconductor layer being provided between the first interconnect and the extension portion, the fifth semiconductor layer being electrically connected to the first interconnect,
the sixth semiconductor layer being provided between the fifth semiconductor layer and the extension portion, the sixth semiconductor layer including a second-conductivity-type impurity with a higher concentration than a second-conductivity-type impurity in the second semiconductor layer.

14. The device according to claim 13, wherein
the semiconductor part has a plurality of the trenches extending in a same direction as the direction in which the second semiconductor layer extends, and
the diode element is provided between adjacent trenches of the plurality of trenches.

15. The device according to claim 1, wherein
the resistance element includes a first resistance portion of the first conductivity type and a second resistance portion of the second conductivity type, and
the first resistance portion and the second resistance portion each extend along the insulating film, the first and second resistance portions being electrically connected in parallel to the first interconnect and the second interconnect.

* * * * *